United States Patent
Ball et al.

(10) Patent No.: US 6,604,671 B2
(45) Date of Patent: *Aug. 12, 2003

(54) BONDHEAD LEAD CLAMP APPARATUS AND METHOD

(75) Inventors: Michael B. Ball, Boise, ID (US); Rich Fogal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/205,943

(22) Filed: Jul. 25, 2002

(65) Prior Publication Data

US 2002/0179687 A1 Dec. 5, 2002

Related U.S. Application Data

(63) Continuation of application No. 09/941,019, filed on Aug. 28, 2001, now Pat. No. 6,435,400, which is a continuation of application No. 09/407,483, filed on Sep. 28, 1999, now Pat. No. 6,325,275, which is a continuation of application No. 08/865,911, filed on May 30, 1997, now Pat. No. 6,000,599, which is a continuation of application No. 08/597,616, filed on Feb. 6, 1996, now Pat. No. 5,647,528.

(51) Int. Cl.[7] .......................... B23K 31/02; B23K 37/04
(52) U.S. Cl. .................. 228/180.5; 228/4.5; 228/44.7; 228/212
(58) Field of Search .............................. 228/180.5, 212, 228/213, 1.1, 110.1, 49.5, 44.7; 269/54.4, 54.5, 903, 54.1, 141, 151, 164; 219/161, 56.21, 56.22; 156/73.2

(56) References Cited

U.S. PATENT DOCUMENTS

| | | |
|---|---|---|
| 3,566,207 A | 2/1971 | Adams |
| 3,685,137 A | 8/1972 | Gardiner |
| 3,995,845 A | 12/1976 | Scheffer |
| 4,030,657 A | 6/1977 | Scheffer |
| 4,361,261 A | 11/1982 | Elles et al. |

(List continued on next page.)

OTHER PUBLICATIONS

US 2002/0023944 A1 Ball et al. (Feb. 28, 2002).*

US 2002/0023940 A1 Ball et al. (Feb. 29, 2002).*

H.K. Charles, Jr.; *Electrical Interconnection*; pp. 224–236. (no date).

US 2001/0008248 A1 Ball (Jul. 19, 2001).

US 2001/0027989 A1 Ball (Oct. 11, 2001).

US 2001/0027988 A1 Ball (Oct. 11, 2001).

United States Patent Publication No. US 2002/0023940 A1, published Feb. 28, 2002.

*Primary Examiner*—Tom Dunn
*Assistant Examiner*—Kiley Stoner
(74) *Attorney, Agent, or Firm*—TraskBritt

(57) ABSTRACT

A method of forming improved wire bonds between the contact pads on semiconductor devices and individual lead frame fingers of a lead frame. The method includes the use of an individual independent lead finger clamp during the wire bonding process to provide increased stability of the individual lead finger for improved bonding. If desired, the method also provides for the use of a conventional fixed clamp for the lead fingers during the wire bonding process in addition to the individual independent lead finger clamp during the wire bonding process to provide increased stability of the individual lead finger for improved bonding and also provides for the replacement of the fixed clamp with another, or second, independent clamp.

13 Claims, 4 Drawing Sheets

U.S. PATENT DOCUMENTS

| | | |
|---|---|---|
| 4,434,347 A | 2/1984 | Kurtz et al. |
| 4,527,730 A | 7/1985 | Shirai et al. |
| 4,600,138 A | 7/1986 | Hill |
| 4,603,803 A | 8/1986 | Chan et al. |
| 4,653,681 A | 3/1987 | Dreibelbis et al. |
| 4,765,531 A | 8/1988 | Ricketson et al. |
| 4,778,097 A | 10/1988 | Hauser |
| 4,821,945 A | 4/1989 | Chase et al. |
| 5,035,034 A | 7/1991 | Cotney |
| 5,114,066 A | 5/1992 | Amador et al. |
| 5,148,959 A | 9/1992 | Cain et al. |
| 5,197,652 A | 3/1993 | Yamazaki |
| 5,217,154 A | 6/1993 | Elwood et al. |
| 5,307,978 A | 5/1994 | Ricketson et al. |
| 5,322,207 A | 6/1994 | Fogal et al. |
| 5,384,155 A | 1/1995 | Abbott et al. |
| 5,421,503 A | 6/1995 | Perlberg et al. |
| 5,425,491 A | 6/1995 | Tanaka et al. |
| 5,445,306 A | 8/1995 | Huddleston |
| 5,465,899 A | 11/1995 | Quick et al. |
| 5,647,528 A | 7/1997 | Ball et al. |
| 5,673,845 A | 10/1997 | Ball |
| 5,890,644 A | 4/1999 | Ball |
| 6,000,599 A | 12/1999 | Ball et al. |
| 6,047,877 A | 4/2000 | Ball |
| 6,062,459 A | 5/2000 | Sabyeying |
| 6,290,116 B1 | 9/2001 | Ball et al. |
| 6,305,593 B1 | 10/2001 | Ball |
| 6,325,275 B1 | 12/2001 | Ball et al. |
| 6,435,400 B1 * | 8/2002 | Ball et al. |
| 6,464,123 B2 | 10/2002 | Ball et al. |

\* cited by examiner

BONDHEAD LEAD CLAMP APPARATUS AND METHOD

CROSS REFERENCE TO RELATED APPLICATIONS

This application is a continuation of application Ser. No. 09/941,019, filed Aug. 28, 2001, now U.S. Pat. No. 6,435,400, issued Aug. 20, 2002, which is a continuation of application Ser. No. 09/407,483, filed Sep. 28, 1999, now U.S. Pat. No. 6,325,275, issued Dec. 4, 2001, which is a continuation of application Ser. No. 08/865,911, filed May 30, 1997, now U.S. Pat. No. 6,000,599, issued Dec. 14, 1999, which is a continuation of application Ser. No. 08/597,616, filed Feb. 6, 1996, now U.S. Pat. No. 5,647,528, issued Jul. 15, 1997.

BACKGROUND OF THE INVENTION

1. Field of the Invention

The present invention is related to forming wire bonds between the contact pads on semiconductor devices and individual lead frame fingers of a lead frame.

More specifically, the present invention is related to the apparatus and method of forming improved wire bonds between the contact pads on semiconductor devices and individual lead frame fingers of a lead frame using one or more independently actuated bondhead lead clamps during the bonding process.

2. State of the Art

Well known types of semiconductor chip devices are connected to a component known as lead frames and subsequently encapsulated in plastic for use in a wide variety of applications. The lead frame is typically formed from a single continuous sheet of metal, typically by metal stamping operations. The lead frame includes an outer supporting frame, a central semiconductor chip supporting pad and a plurality of lead fingers, each lead finger having, in turn, a terminal bonding portion near the central chip supporting pad. Ultimately, the outer supporting frame of the lead frame is removed after the wire bonds between the contact pads of the semiconductor chip device and the lead fingers are made.

Since the lead frames are formed continuously using stamping operations, they are typically continuously rolled on a suitable reel and provided for use. Such reeling operations of the lead frames cause the lead frames to have induced deformations therein leading to lead frames exhibiting longitudinal curvature and transverse curvature. Such lead frame curvature and any attendant deformation of the lead frame cause problems in the formation of reliable wire bonds with the contact pads of semiconductor devices and the individual lead fingers of the lead frame, particularly, when the size of the semiconductor is decreased, the number of contacts pads on the semiconductor device is increased, and the number of lead fingers on the lead frame is increased.

Typical apparatus and methods for forming the wire bonds between the contact pads on semiconductor devices and the lead fingers of lead frames are illustrated in U.S. Pat. Nos. 4,361,261, 4,527,730, 4,600,138, 4,653,681, 4,765,531, and 5,465,899. However, such apparatus and methods do not address the problem of deformed lead frames and their effect on the wire bonds.

Typically, the deformation of the lead frames and its effect on the quality of wire bonds have been dealt with through the use of clamps on portions of the lead frames during the wire bonding operation. In U.S. Pat. No. 4,434,347, a circular fixed clamp is used to retain the lead fingers of the lead frame during the wire bonding operation. A spring loaded electrode is used to heat the end of the lead finger to help improve bonding of the wire.

In U.S. Pat. No. 5,322,207, a fixed clamp is used to retain the lead frame during the automated wire bonding process for connecting the bond pads of a semiconductor device to lead fingers of a lead frame.

In U.S. Pat. No. 5,307,978, a fixed clamp is illustrated for use in an apparatus and method for orienting bonding sites of a lead frame having a plurality of bonding sites.

In U.S. Pat. No. 5,035,034, a hold-down clamp having a multi-fingered interchangeable insert for wire bonding semiconductor lead frames is illustrated. The clamp insert 21 includes a plurality of individual fingers 22 to be used to bias a lead finger of a lead frame in the wire bonding process to provide a better wire bond.

In U.S. Pat. No. 3,685,137, jaws 26 and 28 of a lead frame clamp are used to force the lead fingers of a lead frame into a fixed position during the wire bonding process.

In U.S. Pat. No. 4,821,945, a method and apparatus for the single lead automated clamping and bonding of lead fingers of lead frames are illustrated. However, such apparatus and method are used to replace the fixed clamp during such wire bonding. Additionally, the individual clamp is concentrically located with respect to the wire bonding apparatus and must rotate therearound during wire bonding operations.

While such prior art apparatus and methods have been directed in attempting to solve the problems of forming reliable wire bonds between the contact pads of semiconductor devices and lead fingers of lead frames, they have not been as successful as envisioned.

The present invention is directed to an improved wire bonding apparatus and method for forming such wire bonds.

SUMMARY OF THE INVENTION

The present invention is related to the apparatus and method of forming improved wire bonds between the contact pads on semiconductor devices and individual lead frame fingers of a lead frame. The present invention includes the use of an individual independent lead finger clamp during the wire bonding process to provide increased stability of the individual lead finger for improved bonding. If desired, the present invention also provides for the use of a conventional fixed clamp for the lead fingers during the wire bonding process in addition to the individual independent lead finger clamp to provide increased stability of the individual lead finger for improved bonding. The present invention also contemplates the replacement of the fixed clamp with another, or second, independent clamp in addition to the first individual independent lead finger clamp during the wire bonding process.

BRIEF DESCRIPTION OF THE SEVERAL VIEWS OF THE DRAWINGS

The present invention will be better understood when the description of the invention is taken in conjunction with the drawings wherein.

DETAILED DESCRIPTION OF THE INVENTION

Figure 1:
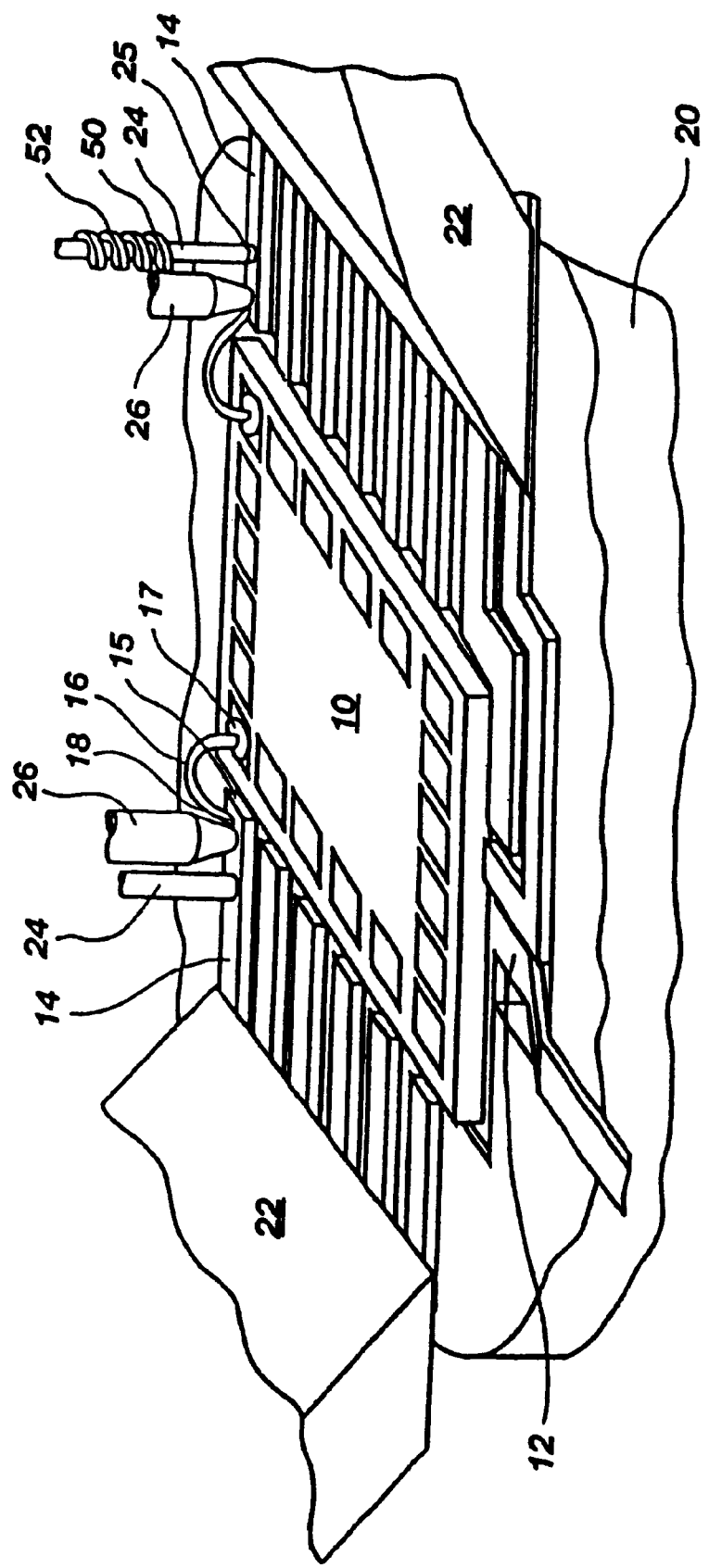
FIG. 1 is a perspective view of the present invention used in a wire bonding process.

Referring to drawing FIG. 1, a semiconductor chip (die) 10 is shown being supported by the paddle 12 of a lead frame. A heat block 20 is used to heat the paddle 12, die 10, and lead fingers 14 during the wire bonding process. As shown, a suitable wire 16 has one end thereof 17 bonded to a bond pad of the die 10. The wire 16 may be of any suitable type for connection and bonding purposes, such as gold, gold alloy, aluminum, aluminum alloy, etc. The other end 18 of the wire 16 is shown being bonded to the end 15 of a lead finger 14 of the lead frame by a suitable bonding apparatus 26. The bonding apparatus 26 may be of any suitable type well known in the bonding area, such as a tailless thermosonic or ultrasonic capillary type bonding apparatus which dispenses wire during the bonding process. As previously stated, the lead finger 14 is in contact with the heat block 20 to heat the lead finger 14 to a suitable temperature for the bonding operation to help insure a satisfactory wire bond. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. Further shown in drawing FIG. 1 is independently actuated lead clamp 24 used in place of or in addition to the conventional clamp 22 to maintain the lead finger 14 in position during the bonding process. The independent clamp 24 helps insure that the lead finger is in contact with the heat block 20 during the bonding process and helps minimize any deflection of the end 15 of the lead finger 14 so that the bonding apparatus 26 accurately, precisely contacts the end 15 to provide the desired wire bond. The action of independent clamp 24, and if desired the additional use of fixed clamp 22, provides improved clamping of a lead finger 14 during the wire bonding process as well as insures that the lead finger 14 is in intimate contact with the heat block 20 for effectiveness.

During the wire bonding process, it is desirable for the heat block to be heated to substantially 230 degrees Centigrade. Although the heat block may be any suitable temperature during the bonding operation, the heat block 20 temperature should not exceed 300 degrees Centigrade to prevent thermal damage to the die 10. It is further preferred that the bond of the end 18 of the wire 16 made to the end 15 of the lead finger 14 be made at a temperature of substantially 190 degrees Centigrade for bonding effectiveness. It is also preferred that the bonding apparatus exert a bonding force of substantially 50 to 100 grams when bonding the end 18 of the wire 16 to the end 15 of lead finger 14 for effective bond formation of the wire 16 to lead finger 14.

The independent clamp 24 may be of any suitable shape for use in independently clamping the lead finger 14, in place of the use of conventional fixed clamp 22, such as square, semicircular, rectangular, arcuate, etc. Also, as shown, the independent clamp 24 may be resiliently mounted through the use of a shoulder 50 thereon abutting a spring 52 to control the amount of the force exerted on any lead finger 14 during the wire bonding operation. If desired, the independent clamp 24 may include insulation or cushioning 25 on the end thereof. The independent clamp 24 is actuated independently of bonding apparatus 26 and has the capability of independent movement along the x-axis, y-axis and z-axis with respect to the bonding apparatus 26. The independent clamp 24 is also free to move about the bonding apparatus 26 and the central axis of the die 10 so that any lead finger 14 that is to be connected to bond pads on the die 10, regardless of location, may be accommodated. The independent clamp 24 does not need to be, and preferably is not, concentrically centered about the bonding apparatus 26 so that it will not interfere with the operation thereof. Any desired number of independent clamps 24 may be used about the bonding apparatus to minimize the amount of movement of the independent clamp 24 between wire bonding operations. The independent clamps 24 may be located in quadrants about the die 10, or in any manner as desired.

Figure 2:
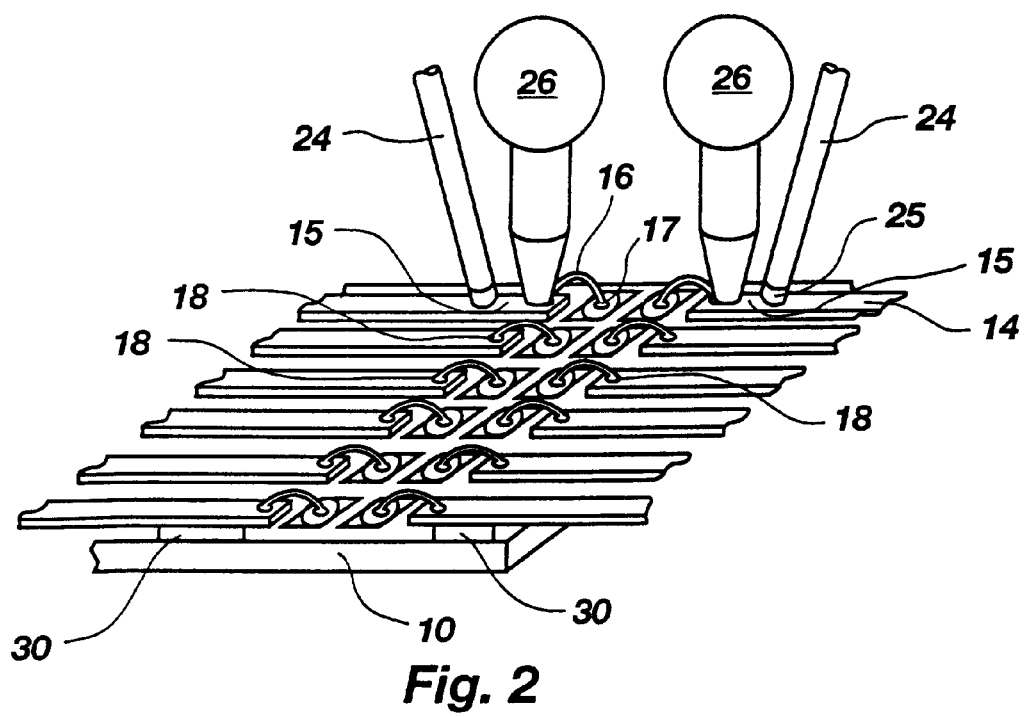
FIG. 2 is a perspective view of a lead-over-chip semiconductor device having the bond pads thereof connected to the lead fingers of a lead frame.

Referring to drawing FIG. 2, a lead over chip configuration using the present invention is shown. The lead fingers 14 are located over the chip (die) 10 for wire bonding thereto. In such a configuration, the lead fingers 14 are secured to the die 10 by insulating adhesive strips 30. During the bond operation, one or more of the independent clamp 24 clamps the end 15 of lead finger 14 prior to the bonding of a wire 16 thereto by one or more of the bonding apparatus 26. The independent clamp 24 applies sufficient pressure to the end 15 of the lead finger 14 to compress the insulating adhesive strips 30 to insure a satisfactory bond between the end of any wire 16 and the end 15 of the lead finger 14.

Figure 3:
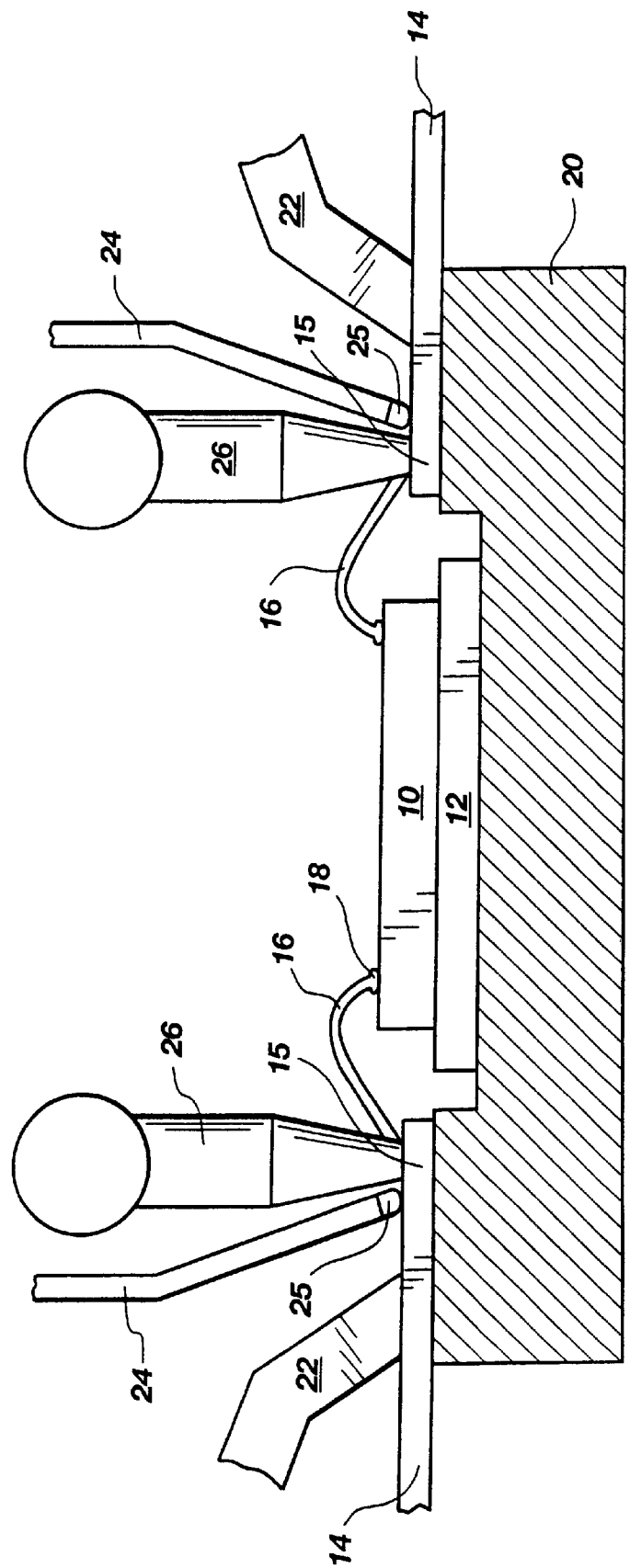
FIG. 3 is a side view of the present invention used in the wire bonding of a semiconductor chip arrangement.

Referring to drawing FIG. 3, a die 10 is shown having a plurality of wires 16 bonded thereto. As shown, one or more of the independent clamps 24 contacts the end 15 of lead finger 14 aft of the area of the wire end 18 to the lead finger 14. The bonds of the wire end 18 to the end 15 of the lead finger 14 are typically a wedge type wire bond, although a ball bond may be made if desired. As shown, the heat block 20 is in contact with the paddle 12 of the lead frame and the lead fingers 14.

Figure 4:
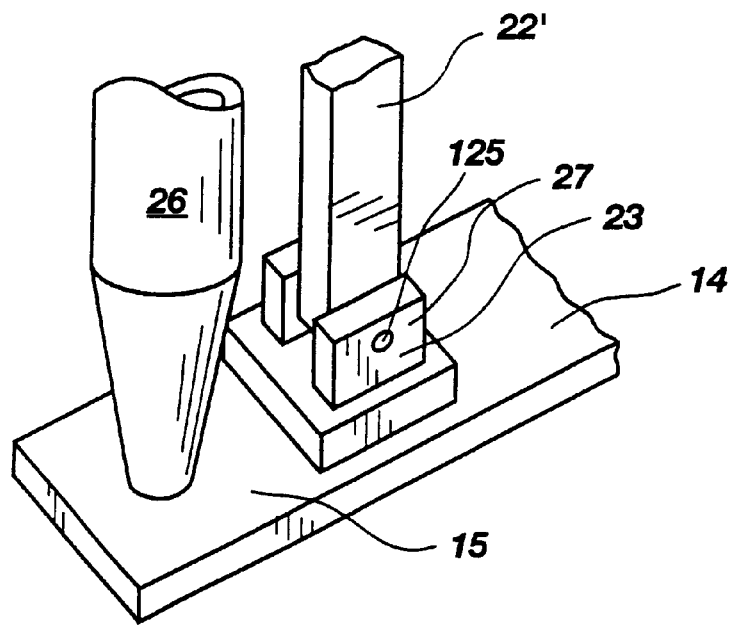
FIG. 4 is a perspective view of a second alternative type of independent lead clamp of the present invention.

Referring to drawing FIG. 4, a portion of a lead finger 14 is shown in conjunction with a bonding apparatus 26 and modified independent lead clamp 22'. The independent lead clamp 22' is formed having a modified end or foot 23 thereon to provide a larger clamping area of the clamp 22' on the end 15 of the lead finger 14 during bonding operations. The modified end or foot 23 is substantially the same width as the lead finger 14 and may be mounted to have articulated movement about the end of the independent clamp 22' such as using a pin 125 extending through suitable apertures in a pair of ears 27 attached to the foot 23 and the end of the modified independent clamp 22' for illustration purposes.

Figure 5:
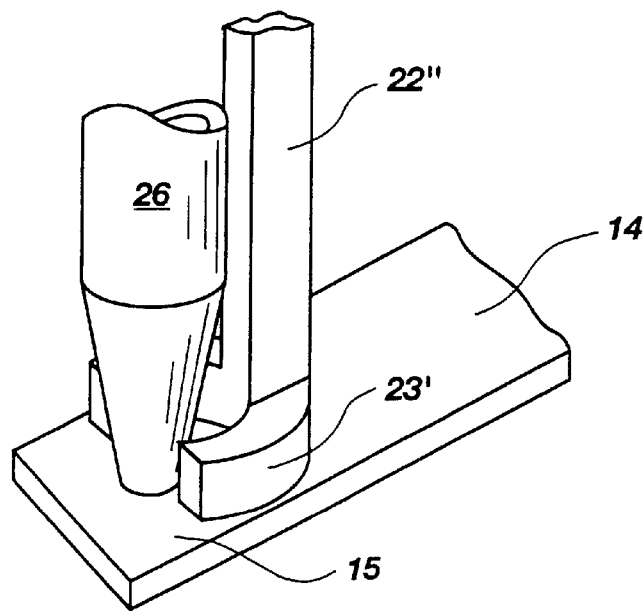
FIG. 5 is a perspective view of a third alternative type of independent lead clamp of the present invention.

Referring to drawing FIG. 5, an independent clamp 22' is shown having a modified end or foot 23' located on the end thereof. The end or foot 23' may be integrally attached to the clamp 22' or may have an articulated mounting arrangement, such as shown in drawing FIG. 4. In this instance, the modified end or foot 23' is generally semicircular, or arcuate, in configuration so as to engage a large portion of the end 15 of the lead finger 14 surrounding the bonding apparatus 26 during the wire bonding operation to hold the end 15 in position.

Figure 6:
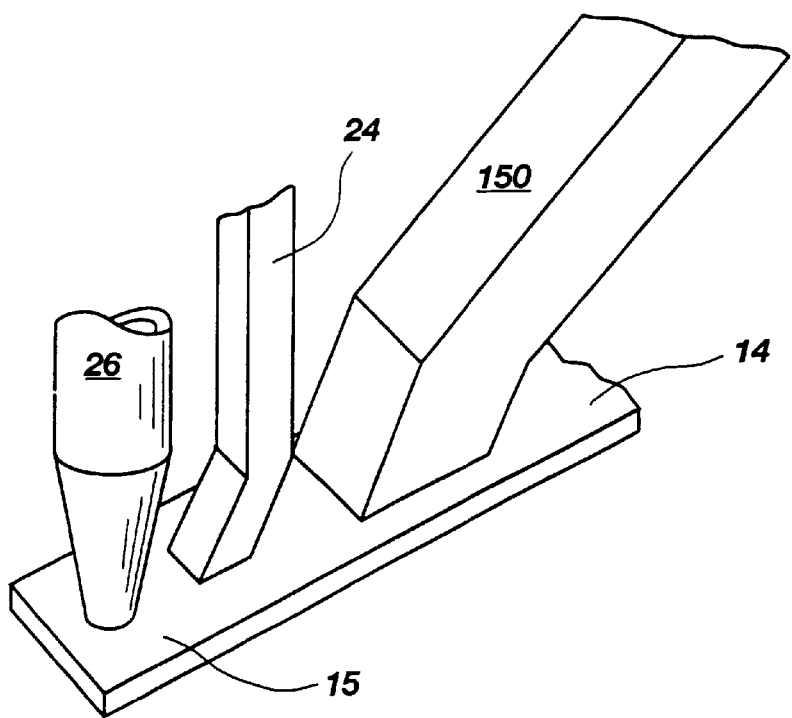
FIG. 6 is a perspective view of the use of two independent lead clamps of the present invention in a wire bonding operation with a lead finger of a lead frame.

Referring to drawing FIG. 6, the independent clamp 24 is shown in relation to the bonding apparatus 26 on the end 15 of a lead finger 14 as well as further being shown in relation to a second independently actuated clamp 150 located thereon during wire bonding operations. The second independently actuated clamp 150 may be of any suitable type and structure such as described and illustrated hereinbefore. The clamp 24 and second clamp 150 may be actuated independently of each other and independently of the bonding apparatus 26 as described and illustrated hereinbefore.

METHOD OF BONDING

Referring to drawing FIGS. 1 through 3, in the method of the present invention, a die 10 is positioned within the bonding area of the bonding apparatus 26. If desired, for use in addition to an individual independent clamp 24, a conventional clamp 22 serves to help straighten the lead frame and position the lead fingers 14 during subsequent bonding operations. Next, the die 10 and the lead finger 14 are heated to the desired temperature before bonding operations by the heater block 20. At this time, the independent clamp 24 is engaged, moved to the appropriate lead finger 14 which is to have a wire bonded thereto, and the clamp 24 actuated to clamp the end 15 of the lead finger 14 against the heat block 20 or the adhesive strip 30. The wire bonding apparatus 26 is then actuated to form a wire bond on end 17 of wire 16 to an appropriate bond pad on die 10. After the formation of the bond of end 17 of wire 16 to the bond pad of die 10, the bonding apparatus is moved to appropriate end 15 of lead finger 14 for the formation of a suitable wire bond thereto by end 18 of wire 16. After the formation of the bond of the end 18 of wire 16 to the end 15 of lead finger 14, the independent clamp 24 and the bonding apparatus are actuated to substantially simultaneously remove the clamp 24 and the bonding apparatus 26 from the end 15 of the lead finger 14. Alternately, the bonding apparatus 26 is actuated to remove the apparatus from the bond location at the end 15 of the lead finger 14 either prior to or after the removal of the independent clamp 24 from a lead finger 14. During the removal of the bonding apparatus 26 from the end 15 of the lead finger 14, if used in addition to the independent clamp 24, a conventional clamp 22, if in contact with a lead finger 14, supplies the necessary force to retain the finger 14 in position relative to other lead fingers located around die 10, both bonded and unbonded. As previously stated, it is not necessary for the independent clamp 24 to remain in contact with the end 15 of lead finger 14 during the removal of the bonding apparatus 26 therefrom. After the wire 16 has been bonded to the desired bond pad of die 10 and end 15 of lead finger 14, the process is repeated until all desired wire bonds between lead fingers 14 and bond pads of die 10 are completed.

If desired to have additional clamping of the lead finger 14, either a fixed clamp 22 and/or a second independent clamp 150 may be used with the bonding apparatus 26. The second independent clamp 150 may be actuated and moved from the lead finger 14 with, before, or after the removal of the bonding apparatus 26 from the lead finger 14.

It will be understood that the present invention may have changes, additions, deletions modifications, and sequence of operation which fall within the scope of the invention. For instance, the fixed clamp may be eliminated and a second independent clamp used in its place.

What is claimed is:

1. A wire bonding method for bonding a portion of a wire to a portion of at least one lead finger of a lead frame using a movable clamp comprising:

providing an independently movable clamp comprising a clamp movable in at least one x-axis direction, at least one y-axis direction, and at least one z-axis direction;

positioning said independently movable clamp over a portion of said at least one lead finger for maintaining said at least one lead finger in position for attaching of at least said portion of said wire thereto; and providing an apparatus for bonding said portion of said wire to said portion of said at least one lead finger.

2. The method of claim 1, further comprising:

actuating said apparatus for bonding said portion of said wire to said at least one lead finger.

3. The method of claim 2, further comprising:

disengaging said independently movable clamp from said portion of said at least one lead finger before removal of said apparatus from said at least one lead finger.

4. The method of claim 1, wherein said independently movable clamp comprises a resiliently mounted clamp.

5. A wire bonding method for bonding a portion of a wire to a portion of a lead finger of a lead frame using a first clamp and an independently movable clamp comprising:

positioning a first clamp over a portion of said lead finger for maintaining said lead finger in a position during said bonding said portion of said wire thereto, said first clamp comprising a clamp movable in at least one x-axis direction, at least one y-axis direction, and at least one z-axis direction;

positioning an independent clamp over another portion of said lead finger for retaining said lead finger in said position during said bonding of said wire thereto; and providing an apparatus for bonding said portion of said wire to a portion of said lead finger.

6. The method of claim 5, further comprising:

actuating said apparatus for bonding said portion of said wire to a portion of said lead finger.

7. The method of claim 6, further comprising:

removing said independent clamp from engagement with said portion of said lead finger before removal of said apparatus from said lead finger.

8. The method of claim 5, wherein said independent clamp comprises a resiliently mounted clamp.

9. A wire bonding method for bonding at least a portion of a wire to a portion of a lead finger of a lead frame using a plurality of clamps comprising:

positioning a first independent clamp over a portion of said lead finger for retaining said lead finger for bonding a portion of said wire thereto, said first independent clamp movable in at least one x-axis direction, at least one y-axis direction, and at least one z-axis direction;

positioning a second independent clamp over another portion of said lead finger for restraining said lead finger in a position for said bonding of said wire thereto, said second independent clamp movable in said at least one x-axis direction, said at least one y-axis direction, and said at least one z-axis direction; and providing an apparatus for bonding said portion of said wire to a portion of said lead finger.

10. The method of claim 9, further comprising:

actuating said apparatus for bonding said portion of said wire to said portion of said lead finger.

11. The method of claim 10, further comprising:

removing said second independent clamp from said portion of said lead finger before removal of said apparatus from said lead finger.

12. The method of claim 9, wherein said second independent clamp comprises a clamp for positioning between said first independent clamp and an end of said lead finger.

13. The method of claim 9, wherein said first independent clamp and said second independent clamp each comprise an independently movable clamp with respect to each other clamp and said lead finger.

* * * * *

UNITED STATES PATENT AND TRADEMARK OFFICE
CERTIFICATE OF CORRECTION

| | |
|---|---|
| PATENT NO. | : 6,604,671 B2 |
| APPLICATION NO. | : 10/205943 |
| DATED | : August 12, 2003 |
| INVENTOR(S) | : Michael B. Ball and Rich Fogal |

It is certified that error appears in the above-identified patent and that said Letters Patent is hereby corrected as shown below:

On the title page:
In ITEM (54) "Title"    change "BONDHEAD LEAD CLAMP APPARATUS AND METHOD" TO --BONDHEAD LEAD CLAMP METHODS--

In the drawings:
In FIG. 3,    delete reference numeral "18" and associated lead line and reinsert reference numeral --18-- and associated lead line on the right-hand portion of the figure

Replace FIG. 3 with the following:

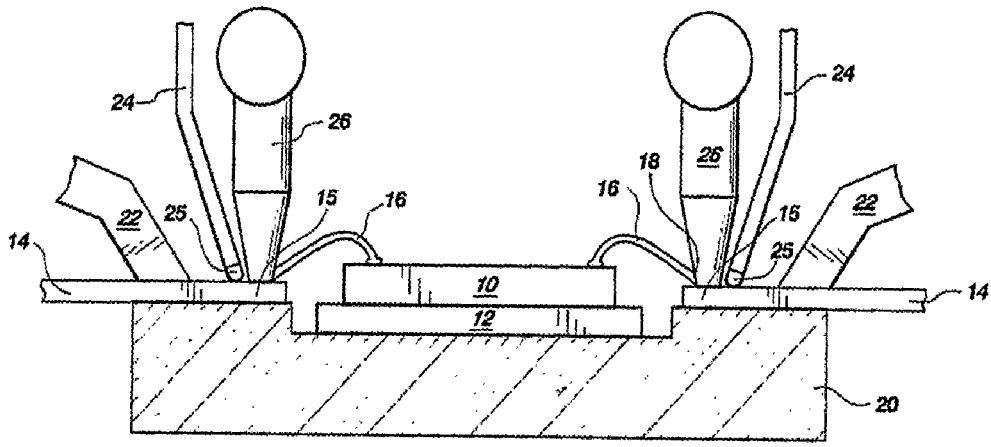

Fig. 3

In the specification:
COLUMN 1,    LINES 1-2,    change "BONDHEAD LEAD CLAMP APPARATUS AND METHOD" TO --BONDHEAD LEAD CLAMP METHODS--
COLUMN 1,    LINE 54,    change "of contacts pads" to --of contact pads--
COLUMN 3,    LINE 28,    change "insure" to --ensure--
COLUMN 3,    LINE 38,    change "insure" to --ensure--

UNITED STATES PATENT AND TRADEMARK OFFICE
CERTIFICATE OF CORRECTION

PATENT NO. : 6,604,671 B2
APPLICATION NO. : 10/205943
DATED : August 12, 2003
INVENTOR(S) : Michael B. Ball and Rich Fogal It is certified that error appears in the above-identified patent and that said Letters Patent is hereby corrected as shown below:

In the specification: (cont'd)

| | | | |
|---|---|---|---|
| COLUMN 3, | LINE 46, | change "insures" to --ensures-- |
| COLUMN 4, | LINE 29, | change "insure" to --ensure-- |
| COLUMN 4, | LINE 53, | change "clamp 22' is" to --clamp 22" is-- |
| COLUMN 4, | LINE 56, | change "clamp 22' or" to --clamp 22" or-- |
| COLUMN 5, | LINE 16, | change "heater block 20." to --heat block 20.-- |
| COLUMN 5, | LINE 47, | change "a second independent" to --an independent-- |
| COLUMN 5, | LINE 48, | change "clamp 150 may" to --clamp 24 may-- |
| COLUMN 5, | LINE 49, | change "second independent clamp 150 may" to --independent clamp 24 may-- |

In the claims:
CLAIM 6, COLUMN 6, LINE 29, change "wire to a portion" to --wire to said portion--

Signed and Sealed this

Twenty-seventh Day of March, 2007

JON W. DUDAS
*Director of the United States Patent and Trademark Office*